(12) United States Patent
Sun

(10) Patent No.: US 8,152,596 B2
(45) Date of Patent: Apr. 10, 2012

(54) APPARATUS FOR DEBURRING BOARDS

(75) Inventor: Yushan Sun, Hubei (CN)

(73) Assignees: Universal Scientific Industrial (Shanghai) Co., Ltd., Shanghai (CN); Universal Global Scientific Industrial Co., Ltd., Nantou (TW)

( * ) Notice: Subject to any disclaimer, the term of this patent is extended or adjusted under 35 U.S.C. 154(b) by 901 days.

(21) Appl. No.: 12/196,413

(22) Filed: Aug. 22, 2008

(65) Prior Publication Data
US 2010/0043158 A1 Feb. 25, 2010

(51) Int. Cl.
*B24B 9/00* (2006.01)
(52) U.S. Cl. .......................................... 451/6; 451/314
(58) Field of Classification Search .................. 451/319, 451/320, 314, 321, 486, 555, 313
See application file for complete search history.

(56) References Cited

U.S. PATENT DOCUMENTS

| | | | | |
|---|---|---|---|---|
| 1,962,120 A | * | 6/1934 | Bickart | 451/321 |
| 2,467,650 A | * | 4/1949 | Ashworth | 451/314 |
| 3,875,825 A | * | 4/1975 | Buttafuoco | 76/83 |
| 4,442,636 A | * | 4/1984 | Obland | 451/558 |
| 4,679,356 A | * | 7/1987 | Thomas | 451/558 |

* cited by examiner

*Primary Examiner* — Robert Rose
(74) *Attorney, Agent, or Firm* — Finnegan, Henderson, Farabow, Garrett & Dunner, L.L.P.

(57) ABSTRACT

An apparatus for deburring boards includes a platform, on which first and second guiding rail units perpendicular to each other are fixed, a deburring unit mounted on the first guiding rail unit, a carrying unit adapted for carrying the boards and mounted movably on the second guiding rail unit perpendicular to the first guiding rail unit, and a driving unit disposed on the platform and operable to drive the carrying unit to move between a loading/unloading zone, where the carrying unit is spaced apart from the deburring unit, and a processing zone, where the carrying unit is disposed between opposite deburring members of the deburring unit so that opposite deburred edges of each board contact respectively the deburring members. The driving unit further drives the carrying unit to move back and forth within the processing zone a predetermined number of times, thereby deburring the boards.

16 Claims, 6 Drawing Sheets

APPARATUS FOR DEBURRING BOARDS

BACKGROUND OF THE INVENTION

1. Field of the Invention

The invention relates to an apparatus for deburring boards.

2. Description of the Related Art

Generally, a printed circuit board having a desired size is obtained by cutting a large board, and thus has burred edges. Therefore, it is required to deburr the burred edges. Conventionally, deburring processing for a printed circuit board is manually performed by two operators for about 40~50 seconds, thereby requiring a high processing cost. Furthermore, shavings generated from the printed circuit board during deburring processing will result in a danger to health.

SUMMARY OF THE INVENTION

Therefore, the object of the present invention is to provide an apparatus for deburring boards that can overcome the aforesaid drawbacks of the prior art.

According to the present invention, there is provided an apparatus for deburring a plurality of boards. Each of the boards has two burred edges opposite to each other in a first direction. The apparatus comprises:

a platform;

a first guiding rail unit mounted fixedly on the platform and extending in the first direction;

a deburring unit mounted on the first guiding rail unit and including two deburring members spaced apart from each other in the first direction;

a second guiding rail unit mounted fixedly on the platform, disposed above the first guiding rail unit and between the deburring members, and extending in a second direction perpendicular to the first direction;

a carrying unit adapted for carrying the boards thereon, mounted movably on the second guiding rail unit, and movable along the second guiding rail unit on the platform between a loading/unloading zone, where the carrying unit is spaced apart from the deburring unit, and a processing zone, where the carrying unit is disposed between the deburring members so that the burred edges of each of the boards carried on the carrying unit contact respectively the deburring members of the deburring unit; and a driving unit disposed on the platform and operable so as to drive the carrying unit to move between the loading/unloading zone and the processing zone, the driving unit being further operable so as to drive the carrying unit to move back and forth in the second direction within the processing zone a predetermined number of times such that the deburring members of the deburring unit are in frictional contact with the boards, thereby deburring the boards.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
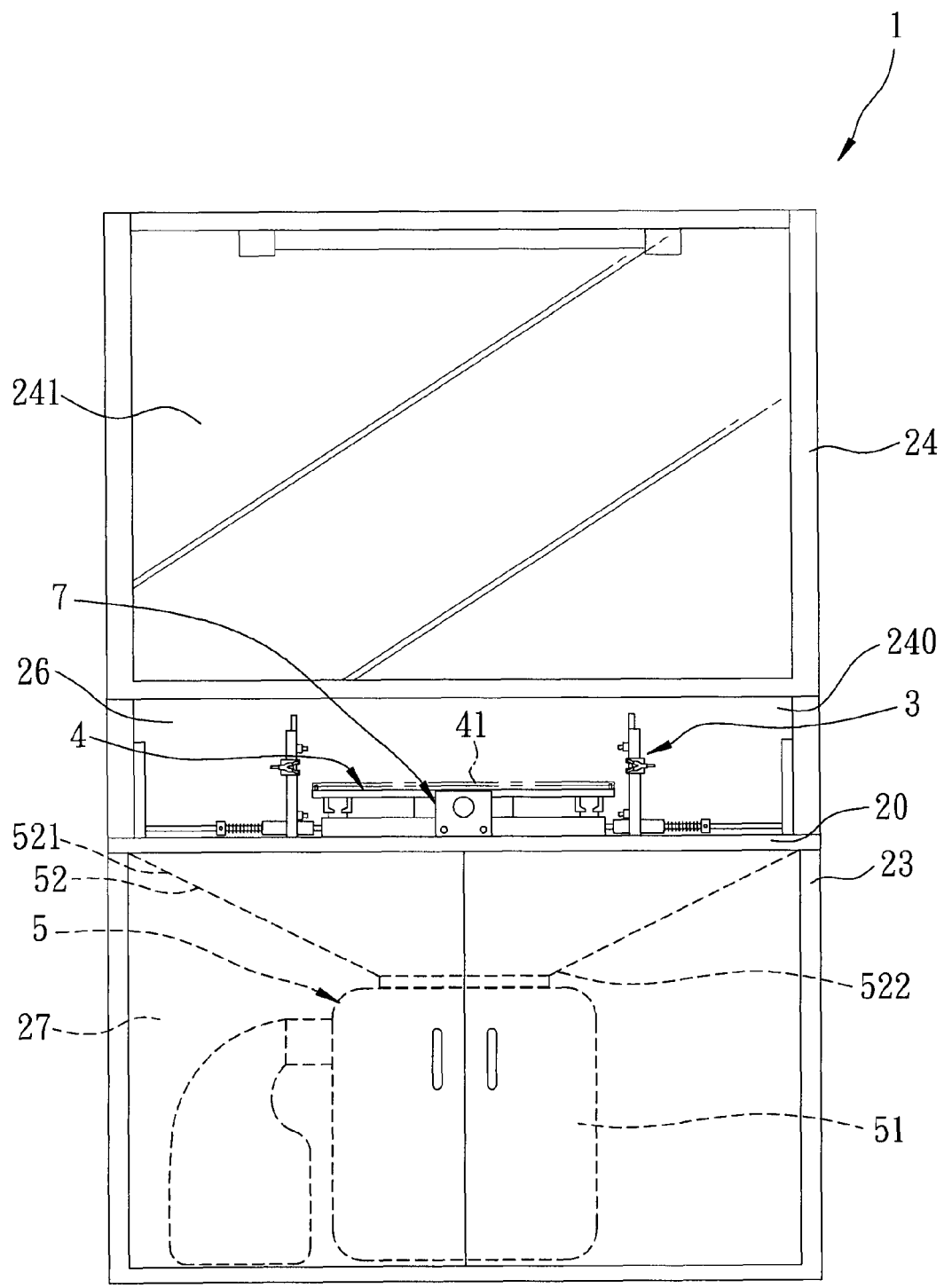
FIG. 1 is a schematic front view showing the preferred embodiment of an apparatus for deburring a plurality of boards according to the present invention.
Figure 2:
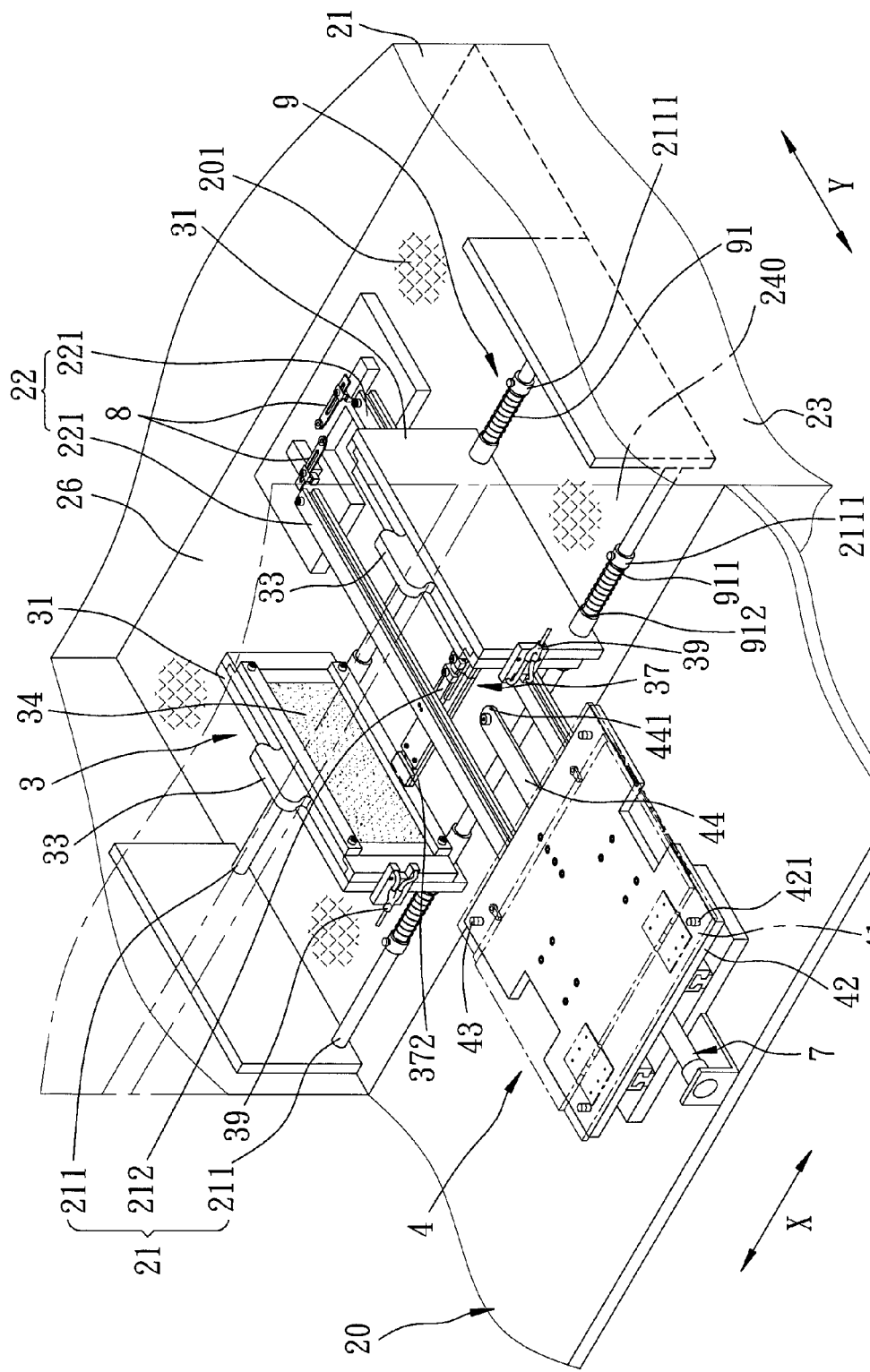
FIG. 2 is a fragmentary perspective view showing the preferred embodiment in a non-processing state.
Figure 3:
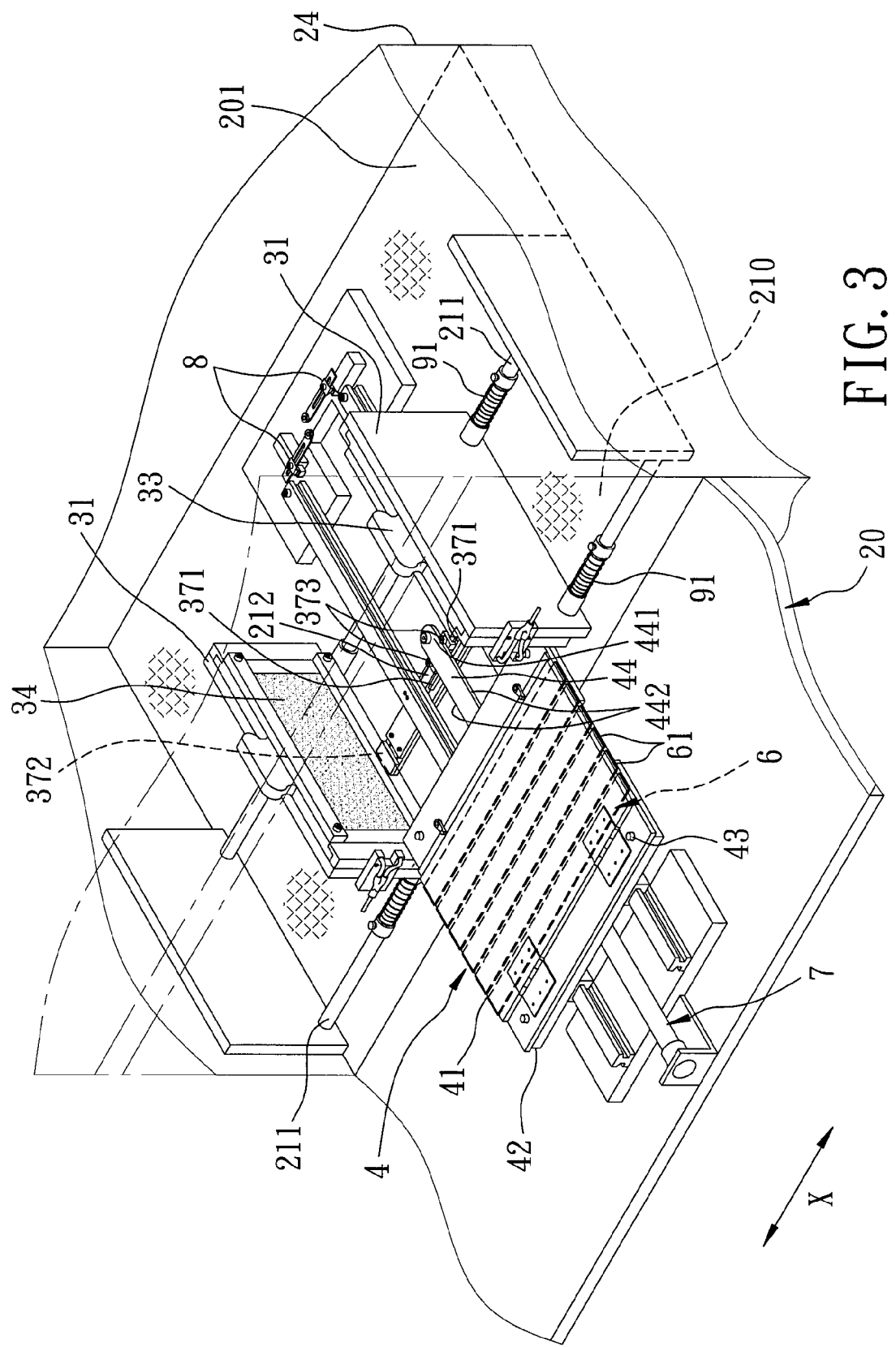
FIG. 3 is a fragmentary perspective view showing the preferred embodiment in a processing state.

Referring to FIGS. 1 to 3, the preferred embodiment of an apparatus 1 for deburring a plurality of boards 6, such as printed circuit boards, according to the present invention is shown to include a platform 20, a first guiding rail unit 21, a second guiding rail unit 22, a deburring unit 3, a carrying unit 4, a driving unit 7, a control switch unit 8, and a shaving-collecting unit 5. In this embodiment, each board 6 has two burred edges 61 opposite to each other in a first direction (X).

In this embodiment, the platform 20 is disposed on a lower housing 23, and has a portion 201 in the form of a net so that the lower housing 23 cooperates with the portion 201 of the platform 201 to define a receiving space 27 therebetween.

The apparatus 1 further includes an upper cover 24 disposed over the portion 201 of the platform 20 so that the upper cover 24 cooperates with the portion 201 of the platform 20 to define a processing space 26 therebetween. The upper cover 24 has a bottom end formed with a notch 240, and a transparent portion 241.

The first guiding rail unit 21 is mounted fixedly on the portion 201 of the platform, and extends in the first direction (X). In this embodiment, the first guiding rail unit 21 includes two parallel elongate main guiding rods 211 disposed fixedly on the portion 201 of the platform 20 and spaced apart from each other in a second direction (Y) perpendicular to the first direction (X). In this embodiment, each main guiding rod 211 is sleeved with a pair of spring-mounting sleeves 2111 spaced apart from each other and positioned selectively thereon, as shown in FIG. 2.

The second guiding rail unit 22 is mounted fixedly on the platform 20, is disposed above the first guiding rail unit 21, and extends in the second direction (Y) so that a part of the second guiding rail unit 22 is disposed on the portion 201 of the platform 20. In this embodiment, the second guiding rail unit 22 includes two parallel elongate guiding rails 221 disposed fixedly on the platform 20 and spaced apart from each other in the first direction (X). It is noted that the guiding rails 221 extend into the processing space 26 through the notch 210. Further, the first guiding rail unit 21 further includes an auxiliary guiding rail 212 disposed in parallel between the main guiding rods 211 and interconnecting fixedly the guiding rails 221 of the second guiding rail unit 22.

The deburring unit 3 is mounted on the first guiding rail unit 21, and is disposed in the processing space 26. In this embodiment, the deburring unit 3 includes two upright plate-mounting seats 31, two insertion plates 33, two deburring members 34, and two abutting blocks 37. Due to the presence of the transparent portion 241 of the upper cover 24, the deburring unit 3 is visible therethrough.

Figure 4:
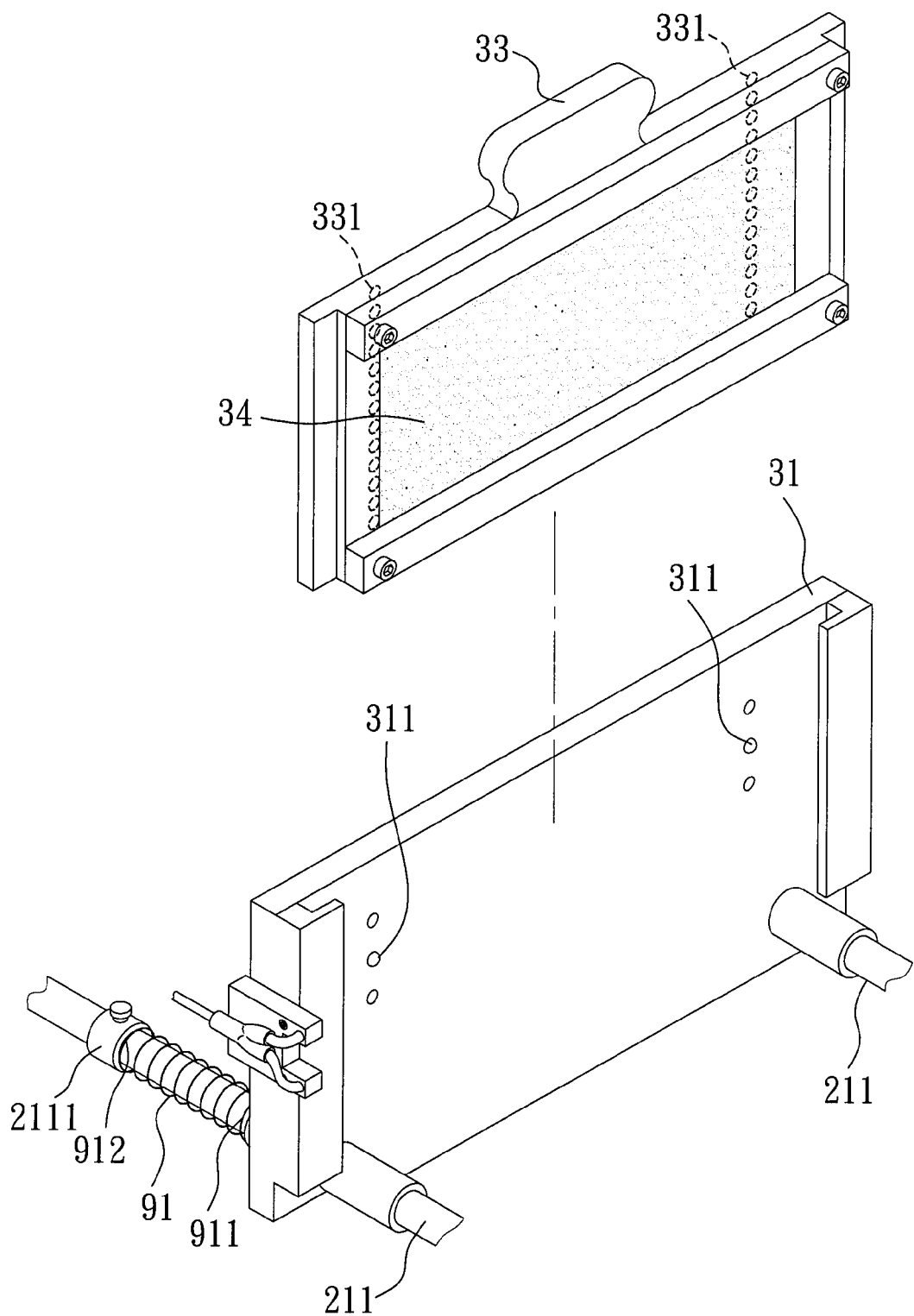
FIG. 4 is a partly exploded perspective view showing a deburring member, an insertion plate and an upright plate-mounting seat of a deburring unit of the preferred embodiment.

The plate-mounting seats 31 are mounted slidably on the main guiding rods 211 of the first guiding rail unit 21 such that the guiding rails 221 of the second guiding rail unit 22 are disposed between the plate-mounting seats 31. Referring further to FIG. 4, each plate-mounting seat 31 is formed with two vertical rows of positioning protrusions 311.

The insertion plates 33 are mounted detachably and respectively on the plate-mounting seats 31. In this embodiment, each insertion plate 33 is formed with two vertical rows of positioning grooves 331. The positioning protrusions 311 of each vertical row for each plate-mounting seat 31 engage respectively selected ones of the positioning grooves 331 of a corresponding one of the vertical rows in a corresponding one of the insertion plates 33.

The deburring members 34 are provided respectively on the insertion plates 33 so that the deburring members 34 face each other and are spaced apart from each other in the first direction (X). In this embodiment, each deburring member 34 is a sheet of sandpaper.

Figure 5:
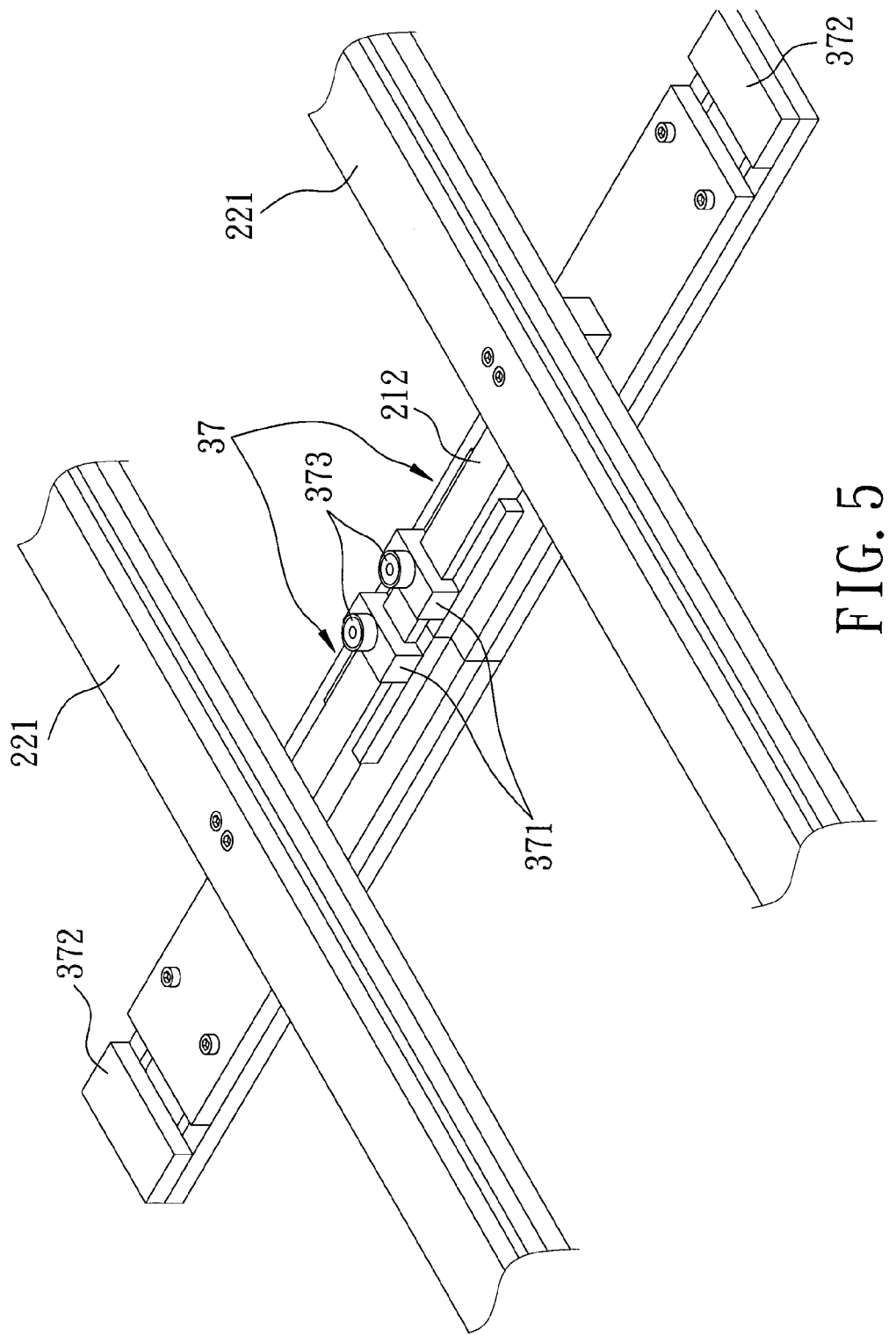
FIG. 5 is fragmentary perspective view showing two abutting blocks of the deburring unit of the preferred embodiment in the non-processing state.

Referring further to FIG. 5, each abutting block 37 has a mounting end 371 sleeved movably on the auxiliary guiding rail 212 of the first guiding rail unit 21, and an abutting end 372 opposite to the mounting end 371 and biasing to contact a corresponding one of the plate-mounting seats 33. Each abutting block 37 is movable relative to the auxiliary guiding rail 212 of the first guiding rail unit 21 between a non-processing position and a processing position. The abutting blocks 37 move away from each other when each abutting block 37 is moved from the non-processing position to the processing position. In this embodiment, each abutting block 37 further has a roller 373 disposed rotatably on the mounting end 371 thereof, wherein the roller 373 is a bearing.

The carrying unit 4 is adapted for carrying the boards 6 thereon, is mounted movably on the second guiding rail unit 22, and is movable along the second guiding rail unit 22 on the platform 20 between a loading/unloading zone, where the carrying unit 4 is spaced apart from the deburring unit 3, and a processing zone, where the carry unit 3 is disposed between the deburring members 34 so that the burred edges 61 of each board 6 carried on the carrying unit 4 contact respectively the deburring members 34 of the deburring unit 3. The processing zone is located in the processing space 26. The notch 240 in the upper cover 24 allows for access of the carry unit 4 into the processing space 26. In this embodiment, the carrying unit 4 includes a mounting seat 42, a carrier 41, and an actuating plate 44.

The mounting seat 42 is mounted movably on the second guiding rail unit 22, and is formed with a plurality of threaded positioning holes 421, as shown in FIG. 2.

Figure 6:
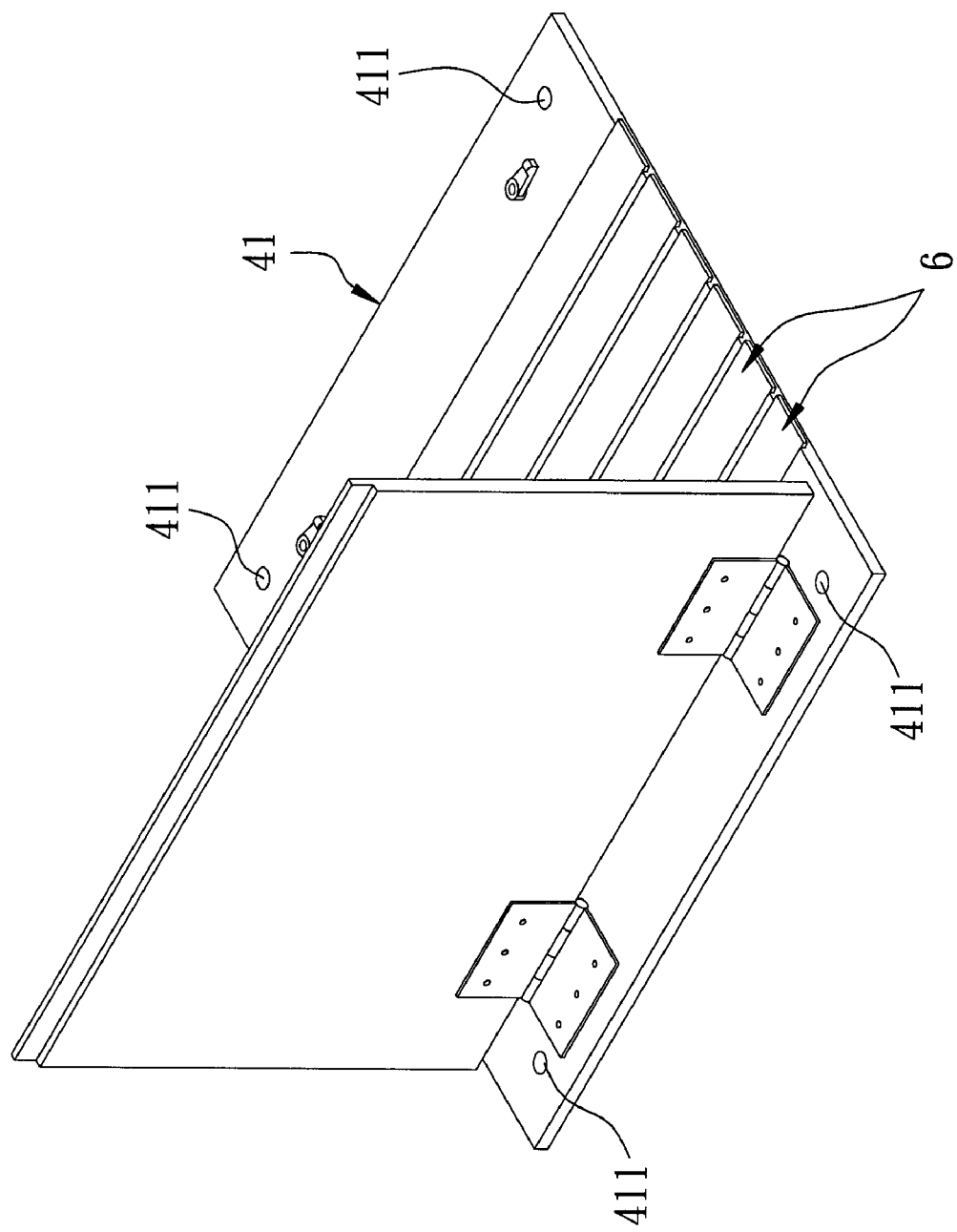
FIG. 6 is a perspective view showing a carrier of the preferred embodiment.

Referring further to FIG. 6, the carrier 41 is mounted detachably on the mounting seat 42, and is adapted for carrying the boards 6 thereon. The carrier 41 is formed with a plurality of through holes 411 corresponding respectively to the positioning holes 421. The carrying unit 4 further includes a plurality of positioning bolts 43 extending respectively through the through holes 411 in the carrier 41 and engaging respectively the positioning holes 421 in the mounting seat 42, thereby positioning the carrier 41 on the mounting seat 42.

The actuating plate 44 extends from the mounting seat 42 in the second direction (Y), and has a curved free end 441, and two sides 442 opposite to each other in the first direction (X). As a result, when the carrying unit 4 is moved from the loading-unloading zone into the processing zone, the actuating plate 44 is inserted between the mounting ends 371 of the abutting blocks 37, and the rollers 373 of the abutting blocks 37 abut rotatably and respectively against the sides 422 of the actuating plate 44 such that each abutting block 37 is pushed by the actuating plate 44 to move from the non-processing position to the processing position, as shown in FIG. 3.

The driving unit 7 is disposed on the platform 20, and is operable so as to drive the carrying unit 4 to move between the loading/uploading zone and the processing zone. The driving unit 7 is further operable so as to drive the carrying unit 4 to move back and forth in the second direction (Y) within the processing zone a predetermined number of times, such as one time or more, such that the deburring members 34 of the deburring unit 3 are in frictional contact with the boards 6, thereby deburring the boards 6. In this embodiment, the driving unit 7 includes a pneumatic cylinder.

The control switch unit 8 is disposed on the portion 201 of the platform 20, and is connected electrically to the driving unit 7. The control switch unit 8 is activated by the free end 441 of the actuating plate 44 of the carrying unit 4 when the carrying unit 4 reaches a limit position within the processing zone distal from the loading-unloading zone so as to output a control signal such that the driving unit 7 drives the carrying unit 4 to move back toward the loading/unloading zone in response to the control signal from the control switch unit 8. On the other hand, the control switch unit 8 is also used to count the predetermined number of times during processing.

The apparatus 1 further includes a biasing unit 9 for biasing the plate-mounting seats 31 of the deburring unit 3 to move toward each other. In this embodiment, the biasing unit 9 includes two pairs of coil springs 91. As shown in FIG. 2, each pair of the coil springs 91 are sleeved respectively on the spring-mounting sleeves 2111 on a corresponding one of the main guiding rods 211 of the first guiding rail unit 21, and have fixing ends 911 connected respectively to the spring-mounting sleeves 2111 on the corresponding one of the main guiding rods 211 of the first guiding rail unit 21, and abutting ends 912 abutting respectively against the plate-mounting seats 31 of the deburring unit 3.

As shown in FIG. 1, the shaving-collecting unit 5 is disposed in the receiving space 27 below the portion 201 of the platform 20, and includes a shaving-collector 51 and a guiding sleeve 52. In this embodiment, the shaving collector 51 is a vacuum cleaner. The guiding sleeve 52 has an upper end 521 connected to a bottom side of the portion 201 of the platform 20, a lower end 522 connected to the shaving collector 51, and an inner diameter that decreases gradually toward the lower end 522.

Furthermore, a shaving-blowing unit is provided for blowing the shavings generated from the boards 6 out of the deburring members 34 of the deburring unit 3. The shaving-blowing unit includes two nozzles disposed on the plate-mounting seats 31 of the deburring unit 3 and coupled to an air pump (not shown) for spurting air toward the deburring members 34.

In sum, since the plurality of the boards 6 carried on the carrying unit 4 can be automatically deburred in one cycle of processing, deburring processing by the apparatus 1 of the present invention can be carried out at a decreased period of time as compared to that by means of the aforesaid conventional manual manner. Moreover, only one operator is required to control the apparatus 1, thereby reducing processing costs of the boards 6. Furthermore, due to the presence of the processing space 26 and the shaving-collecting unit 5, the shavings generated from the boards 6 can be effectively collected, thereby preventing the shavings from spreading out of the processing space 26.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. An apparatus for deburring a plurality of boards, each of the boards having two burred edges opposite to each other in a first direction, said apparatus comprising:
   a platform;
   a first guiding rail unit mounted fixedly on said platform and extending in the first direction;
   a deburring unit mounted on said first guiding rail unit and including two deburring members spaced apart from each other in the first direction;
   a second guiding rail unit mounted fixedly on said platform, disposed above said first guiding rail unit and between said deburring members, and extending in a second direction perpendicular to the first direction;
   a carrying unit adapted for carrying the boards thereon, mounted movably on said second guiding rail unit, and movable along said second guiding rail unit on said platform between a loading/unloading zone, where said carrying unit is spaced apart from said deburring unit, and a processing zone, where said carrying unit is disposed between said deburring members so that the burred edges of each of the boards carried on said carrying unit contact respectively said deburring members of said deburring unit; and
   a driving unit disposed on said platform and operable so as to drive said carrying unit to move between the loading/unloading zone and the processing zone, said driving unit being further operable so as to drive said carrying unit to move back and forth in the second direction within the processing zone a predetermined number of times such that said deburring members of said deburring unit are in frictional contact with the boards, thereby deburring the boards.

2. The apparatus as claimed in claim 1, further comprising a control switch unit disposed on said platform and connected electrically to said driving unit, said control switch unit being activated by said carrying unit when said carrying unit reaches a limit position within the processing zone distal from the loading/loading zone so as to output a control signal such that said driving unit drives said carrying unit to move backward toward the loading/unloading zone in response to the control signal from said control switch unit.

3. The apparatus as claimed in claim 2, wherein said carrying unit includes:
   a mounting seat mounted movably on said second guiding rail unit;
   a carrier mounted detachably on said mounting seat and adapted for carrying the boards thereon; and
   an actuating plate extending from said mounting seat in the second direction and having a curved free end, said control switch unit being activated by said free end of said actuating plate when said carrying unit reaches the limit position within the processing zone.

4. The apparatus as claimed in claim 3, wherein said mounting seat is formed with a plurality of threaded positioning holes, said carrier being formed with a plurality of through holes corresponding respectively to said positioning holes, said carrying unit further including a plurality of positioning bolts extending respectively through said through holes in said carrier and engaging respectively said positioning holes in said mounting seat, thereby positioning said carrier on said mounting seat.

5. The apparatus as claimed in claim 3, wherein:
   said second guiding rail unit includes two parallel elongate guiding rails disposed fixedly on said platform and spaced apart from each other in the first direction;
   said first guiding rail unit includes two parallel elongate main guiding rods disposed fixedly on said platform and spaced apart from each other in the second direction, and an auxiliary guiding rail disposed in parallel between said main guiding rods and interconnecting fixedly said guiding rails of said second guiding rail unit;
   said deburring unit further includes
      two upright plate-mounting seats mounted slidably on said main guiding rods of said first guiding rail unit such that said guiding rails of said second guiding rail unit are disposed between said plate-mounting seats,
      two insertion plates mounted detachably and respectively on said plate-mounting seats and provided respectively with said deburring members thereon so that said deburring members face each other, and
      two abutting blocks each having a mounting end sleeved movably on said auxiliary guiding rail of said first guiding rail unit, and an abutting end opposite to said mounting end and biased to contact a corresponding one of said plate-mounting seats, each of said abutting blocks being movable relative to said auxiliary guiding rail of said first guiding rail unit between a non-processing position and a processing position, said abutting blocks moving away from each other when each of said abutting blocks is moved from the non-processing position to the processing position; and
   when said carrying unit is moved from the loading/unloading zone into the processing zone, said actuating plate of said carrying unit is inserted between said mounting ends of said abutting blocks such that each of said abutting blocks is pushed by said actuating plate of said carrying unit to move from the non-processing position to the processing position.

6. The apparatus as claimed in claim 5, wherein:
   said actuating plate has two sides opposite to each other in the first direction; and
   each of said abutting blocks further has a roller disposed rotatably on said mounting end of a corresponding one of said abutting blocks and abutting rotatably against a corresponding one of said sides of said actuating plate when said carrying unit is disposed in the processing zone.

7. The apparatus as claimed in claim 6, wherein said roller of each of said abutting blocks is a bearing.

8. The apparatus as claimed in claim 6, further comprising a biasing unit for biasing said plate-mounting seats of said deburring unit to move toward each other.

9. The apparatus as claimed in claim 8, wherein said biasing unit includes two pairs of coil springs, each pair of said coil springs being sleeved on a corresponding one of said main guiding rods of said first guiding rail unit and having fixing ends connected to the corresponding one of said main guiding rods of said first guiding rail unit, and abutting ends abutting respectively against said plate-mounting seats of said deburring unit.

10. The apparatus as claimed in claim 5, wherein:
    each of said insertion plates of said deburring unit is formed with at least one vertical row of positioning grooves; and
    each of said plate-mounting seats of said deburring unit is formed with at least one positioning protrusion engaging a selected one of said positioning grooves in a corresponding one of said insertion plates.

11. The apparatus as claimed in claim 1, wherein each of said deburring members includes a sheet of sandpaper.

12. The apparatus as claimed in claim 1, wherein said driving unit includes a pneumatic cylinder.

13. The apparatus as claimed in claim 1, wherein said platform has a portion on which said first guiding rail unit, a part of said second guiding rail unit and said deburring unit are disposed, said apparatus further comprising:

an upper cover disposed over said portion of said platform so that said upper cover cooperates with said portion of said platform to define a processing space therebetween, said upper cover having a bottom end formed with a notch for permitting extension of said second guiding rail unit and for access of said carrying unit into said processing space therethrough, the processing zone being located in said processing space; and a shaving-collecting unit for collecting shavings generated from the boards in said processing space during processing.

14. The apparatus as claimed in claim 13, wherein:
said portion of said platform is in the form of a net;
said shaving-collecting unit is disposed below said portion of said platform, and includes a shaving collector, and a guiding sleeve having an upper end connected to a bottom side of said portion of said platform, a lower end connected to said shaving collector, and an inner diameter that decreases gradually toward said lower end.

15. The apparatus as claimed in claim 13, wherein said upper cover further has a transparent portion, through which said deburring unit is visible.

16. The apparatus as claimed in claim 1, further comprising a shaving-blowing unit for blowing the shavings generated from the boards out of said deburring members of said deburring unit.

* * * * *